United States Patent
Tayebati et al.

(10) Patent No.: US 10,320,145 B2
(45) Date of Patent: Jun. 11, 2019

(54) SOLDER SEALING IN HIGH-POWER LASER DEVICES

(71) Applicants: Parviz Tayebati, Sherborn, MA (US); Michael Deutsch, Derry, NH (US)

(72) Inventors: Parviz Tayebati, Sherborn, MA (US); Michael Deutsch, Derry, NH (US)

(73) Assignee: TERADIODE, INC., Wilmington, MA (US)

( * ) Notice: Subject to any disclaimer, the term of this patent is extended or adjusted under 35 U.S.C. 154(b) by 0 days.

(21) Appl. No.: 15/807,824

(22) Filed: Nov. 9, 2017

(65) Prior Publication Data

US 2018/0069377 A1     Mar. 8, 2018

Related U.S. Application Data

(63) Continuation of application No. 15/006,733, filed on Jan. 26, 2016, now Pat. No. 9,843,164.

(60) Provisional application No. 62/108,278, filed on Jan. 27, 2015.

(51) Int. Cl.
| | |
|---|---|
| H01S 3/04 | (2006.01) |
| H01S 5/022 | (2006.01) |
| H01S 5/40 | (2006.01) |
| H01S 3/08 | (2006.01) |
| H01S 5/14 | (2006.01) |
| H01S 5/02 | (2006.01) |
| H01S 5/024 | (2006.01) |

(52) U.S. Cl.
CPC ...... *H01S 5/02256* (2013.01); *H01S 3/08009* (2013.01); *H01S 5/0216* (2013.01); *H01S 5/02272* (2013.01); *H01S 5/142* (2013.01); *H01S 5/4025* (2013.01); *H01S 5/4062* (2013.01); *H01S 5/4087* (2013.01); *H01S 5/02423* (2013.01)

(58) Field of Classification Search
CPC .. H01S 5/02256; H01S 5/0216; H01S 5/4087; H01S 5/4025; H01S 3/08009; H01S 5/142; H01S 5/4062; H01S 5/02272; H01S 5/02423
See application file for complete search history.

(56) References Cited

U.S. PATENT DOCUMENTS

| | | | | |
|---|---|---|---|---|
| 5,285,463 | A * | 2/1994 | Takuma | H01L 24/81 257/E21.511 |
| 6,588,949 | B1 | 7/2003 | Zhou | |
| 2002/0150134 | A1* | 10/2002 | Kawai | H01S 5/0224 372/36 |
| 2005/0069266 | A1 | 3/2005 | Kouta | |
| 2006/0220259 | A1* | 10/2006 | Chen | H01L 21/563 257/778 |
| 2008/0157347 | A1* | 7/2008 | Takashima | H01S 5/02492 257/712 |
| 2011/0249694 | A1* | 10/2011 | Nishiguchi | H01S 5/0224 372/43.01 |
| 2011/0310921 | A1 | 12/2011 | Chann et al. | |
| 2012/0080789 | A1* | 4/2012 | Shiota | H01L 24/14 257/737 |

(Continued)

*Primary Examiner* — Yuanda Zhang
(74) *Attorney, Agent, or Firm* — Morgan, Lewis & Bockius LLP

(57) ABSTRACT

In various embodiments, laser apparatuses include thermal bonding layers between various components and sealing materials for preventing or retarding movement of thermal bonding material out of the thermal bonding layers.

28 Claims, 8 Drawing Sheets

(56) References Cited

U.S. PATENT DOCUMENTS

| | | |
|---|---|---|
| 2013/0270685 A1 | 10/2013 | Yim et al. |
| 2015/0147022 A1* | 5/2015 | Matsuda ............ H01L 31/02327 385/14 |
| 2015/0263487 A1 | 9/2015 | Yamamoto et al. |
| 2016/0218482 A1 | 7/2016 | Tayebati et al. |
| 2016/0218483 A1 | 7/2016 | Tayebati et al. |

* cited by examiner

SOLDER SEALING IN HIGH-POWER LASER DEVICES

RELATED APPLICATION

This application is a continuation of U.S. patent application Ser. No. 15/006,733, filed Jan. 26, 2016, which claims the benefit of and priority to U.S. Provisional Patent Application No. 62/108,278, filed Jan. 27, 2015, the entire disclosure of each of which is hereby incorporated herein by reference.

TECHNICAL FIELD

In various embodiments, the present invention relates to laser devices such as laser diodes, specifically apparatus and methods for sealing thermal bonding layers in laser devices.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. One such issue is solder creep. High-power lasers typically feature the use of a laser emitter with one or more heat sinks or other thermal-management structures for heat dissipation, and these structures are often coupled to the emitter via a solder or other soft, malleable compound that maintains thermal contact between the emitter and heat sink even in the event of relative movement between the components resulting from thermal cycling.

While such solder-based solutions mitigate some of the reliability issues resulting from thermal cycling during high-power laser operation, the use of solder may also introduce other reliability issues such as solder creep. During solder creep, the solder develops internal voids that can coalesce and lead to crack nucleation. In addition, the solder may slowly work its way out from between the two mating surfaces. This problem is exacerbated by the fact that the components between which the solder is placed are typically clamped or screwed together in order to squeeze the components together and minimize any thermal distortion. This clamping force may increase the solder-creep rate, particularly during high-temperature operation when the solder is typically softer and more flowable.

Thus, there is a need for structures and methods that mitigate creep of solder or other flowable joining compounds in high-power laser devices.

SUMMARY

In accordance with embodiments of the present invention, laser devices incorporating beam emitters such as laser diodes (e.g., single laser diodes, laser diode bars, or arrays thereof) incorporate a thermal bonding material (e.g., a solder or similar material) that is sealed to prevent creep of the thermal bonding material, thereby enhancing thermal conductivity within the laser device and the reliability of the laser device. Specifically, thermal bonding layers between various components of the laser device (e.g., the beam emitter itself and/or heat-sinking components such as electrode mounts and housings) may be sealed with a material (e.g., one or more metals) that is impervious to the propagation of the thermal bonding material therethrough; thus, creep of the thermal bonding material from between the components is substantially prevented. The sealing may be accomplished by, for example, a deposition technique such as electroplating or electroless deposition. In embodiments of the present invention in which the thermal bonding material is disposed between the beam emitter and one or more electrode mounts, the sealing may be performed before or after the beam emitter is affixed to the electrode mount(s) via the thermal bonding material. Portions of the laser device where the sealing material is not desired (e.g., portions of the beam emitter from which the beam(s) are emitted) may be protected from deposition of the sealing material via, e.g., masking or the selective application of an inhibitor material that prevents deposition thereon. In other embodiments, such portions of the laser device may initially be coated with the sealing material, and the sealing material may be later removed via, e.g., etching and/or machining.

In accordance with embodiments of the present invention, laser devices may also be thermally managed via a package that incorporates highly thermally and electrically conductive electrodes for driving the beam emitter, as well as a thermally conductive mount (that may be liquid cooled) that is electrically isolated from the electrodes. Specifically, the electrodes may include, consist essentially of, or consist of copper and be electrically connected to the anode and cathode of the beam emitter. The mount may include, consist essentially of, or consist of, e.g., aluminum, and may incorporate an electrically insulating layer between the mount and the electrode facing the mount. For example, the electrically insulating layer may include, consist essentially of, or consist of aluminum oxide and/or aluminum nitride layers that provide thermal conductivity therethrough but retard or substantially prevent electrical conduction therethrough. Aluminum nitride advantageously has a high thermal conductivity but a low electrical conductivity. As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1\times10^5$ siemens per meter (S/m), at least $1\times10^6$ S/m, or even at least $1\times10^7$ S/m. As utilized herein, materials with a high electrical resistivity, or "electrically insulating materials," have an electrical resistivity of at least $1\times10^8$ ohm·meter (Ω·m), at least $1\times10^{10}$ Ω·m, or even at least $1\times10^{12}$ Ω·m.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As known to those of skill in the art, lasers are generally defined as devices that generate visible or invisible light through stimulated emission of light. Lasers generally have properties that make them useful in a variety of applications, as mentioned above. Common laser types include semiconductor lasers, solid-state lasers, fiber lasers, and gas lasers. Semiconductor lasers (mostly laser diodes) may be electrically or optically pumped and generally efficiently generate very high output powers often at the expense of poor beam quality. Semiconductor lasers may produce low power with good spatial properties for application in, e.g., optical disc players. Yet other semiconductor lasers may be suitable for producing high pulse rate, low power pulses (e.g., for telecommunications applications). Special types of semiconductor lasers include quantum cascade lasers (for mid-infrared light) and surface-emitting semiconductor lasers (VCSELs and VECSELs), the latter also being suitable for pulse generation with high powers.

Solid-state lasers may be based on ion-doped crystals or glasses (e.g., doped insulator lasers) and may pumped with discharge lamps or laser diodes for generating high output power. Alternatively solid-state lasers may produce low power output with very high beam quality, spectral purity and/or stability (e.g. for measurement purposes). Some solid-state lasers may produce ultra-short pulses with picosecond or femtosecond durations. Common gain media for use with solid state lasers include: Nd:YAG, Nd:YVO$_4$, Nd:YLF, Nd:glass, Yb:YAG, Yb:glass, Ti:sapphire, Cr:YAG, and Cr:LiSAF.

Fiber lasers may be based on optical glass fibers which are doped with some laser-active ions in the fiber core. Fiber lasers may achieve extremely high output powers (up to kilowatts) with high beam quality. Narrow line width operation and the like may also be supported by fiber lasers. Gas lasers, which include helium-neon lasers, CO$_2$ lasers, argon ion lasers, and the like, may be based on gases which are typically excited with electrical discharges. Frequently used gases include CO$_2$, argon, krypton, and gas mixtures such as helium . . . neon. In addition, excimer lasers may be based on any of ArF, KrF, XeF, and F$_2$. Other less common laser types include chemical and nuclear pumped lasers, free electron lasers, and X-ray lasers.

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts.

Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that is usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators may be used to collimate the output beam along the fast-axis. Arrays of aspherical cylindrical lenses are often used for collimation of each laser element along the array or slow-axis. To achieve beams with approximately circular beam waist, a special beam shaper for symmetrization of the beam quality of each diode bar or array can be applied. A degrading property of diode bars is the "smile"—a slight bend of the planar nature of the connected emitters. Smile errors may have detrimental effects on the ability to focus beams from diode bars. Another degrading property is collimation error of the slow- and fast-axis. For example, a twisting of the fast-axis collimation lens results in an effective smile. This has detrimental effects on the ability to focus. In stacks, "pointing" error of each bar is often the most dominant effect. Pointing error is a collimation error and is the result of the array or bar that is offset from the fast-axis lens. An offset of 1 µm is the same as the whole array having a smile of 1 µm.

Diode bars and diode arrays overcome limitations of very broad single emitters, such as amplified spontaneous emission or parasitic lasing in the transverse direction or filament formation. Diode arrays may also be operated with a more stable mode profile, because each emitter produces its own beam. Techniques which exploit some degree of coherent coupling of neighbored emitters may result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator without beam conditioning in the slow-axis direction, or a more complex beam shaper to better preserve the brightness. It is also possible to launch the beamlets from the emitters into a fiber bundle (with one fiber per emitter). Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength may also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser apparatus that includes or consists essentially of a beam emitter having first and second opposed surfaces, a first electrode mount disposed proximate (e.g., beneath) the first surface of the beam emitter, a thermal bonding layer, and a sealing material. The thermal bonding layer is disposed at an interface between the first electrode mount and the first surface of the beam emitter. The thermal bonding layer improves thermal conduction between the first electrode mount and the beam emitter. The thermal bonding layer includes, consists essentially of, or consists of a thermal bonding material. The sealing material is disposed along at least a portion of the interface between the first electrode mount and the first surface of the beam emitter. The sealing material may be disposed around substantially the entire interface between the first electrode mount and the first surface of the beam emitter. The sealing material may be disposed over, or even in mechanical contact with, a lateral surface of the thermal bonding layer (e.g., the thermal bonding material). Portions of the sealing material may be in mechanical contact with the first electrode mount and/or the beam emitter. The sealing material may prevent or retard movement of the thermal bonding material out of the thermal bonding layer (i.e., movement of the thermal bonding material from between the first electrode mount and the beam emitter). The sealing material may prevent or retard the formation of voids within the thermal bonding material and/or the thermal bonding layer.

Embodiments of the invention may include one or more of the following in any of a variety of combinations. The beam emitter may include or consist essentially of one or more diode bars each emitting a plurality of discrete beams (e.g., laser beams). The thermal bonding material may include, consist essentially of, or consist of indium or an alloy or mixture of indium with one or more metals. The sealing material may include, consist essentially of, or consist of copper, aluminum, nickel, and/or chromium or an alloy or mixture of two or more of those metals or an alloy of mixture of one of those metals with one or more other metals. The sealing material may be disposed over at least a portion of the external surface of the first electrode mount (i.e., the surface(s) of the first electrode mount not facing and/or in contact with the thermal bonding layer and/or the beam emitter). The sealing material may be disposed over substantially the entire external surface of the first electrode mount. The sealing material may be disposed over at least a portion of the external surface of the beam emitter (i.e., the surface(s) of the beam emitter not facing and/or in contact with the thermal bonding layer and/or the first electrode mount). The sealing material may be disposed over substantially the entire external surface of the beam emitter. The sealing material may not be disposed over the portion of the external surface of the beam emitter from which the beam(s) is/are emitted.

A second electrode mount may be disposed proximate (e.g., over) the second surface of the beam emitter. The second electrode mount may be electrically insulated from the first electrode mount. The second electrode mount may be in electrical contact with the second surface of the beam emitter. A second thermal bonding layer may be disposed at an interface between the second electrode mount and the second surface of the beam emitter. The second thermal bonding layer may include, consist essentially of, or consist of a second thermal bonding material. A second sealing material may be disposed along at least a portion of the interface between the second electrode mount and the second surface of the beam emitter. The second sealing material may be disposed around substantially the entire interface between the second electrode mount and the second surface of the beam emitter. The second sealing material may be disposed over, or even in mechanical contact with, a lateral surface of the second thermal bonding layer (e.g., the second thermal bonding material). Portions of the second sealing material may be in mechanical contact with the second electrode mount and/or the beam emitter. The second sealing material may prevent or retard movement of the second thermal bonding material out of the second thermal bonding layer (i.e., movement of the second thermal bonding material from between the second electrode mount and the beam emitter) The second sealing material may prevent or retard the formation of voids within the second thermal bonding material and/or the second thermal bonding layer. The thermal bonding material and the second thermal bonding material may include, consist essentially of, or consist of the same material. The thermal bonding material and the second thermal bonding material may include, consist essentially of, or consist of different materials. The second sealing material may include, consist essentially of, or consist of copper, aluminum, nickel, and/or chromium or an alloy or mixture of two or more of those metals or an alloy of mixture of one of those metals with one or more other metals. The second sealing material may be disposed over at least a portion of the external surface of the second electrode mount (i.e., the surface(s) of the second electrode mount not facing and/or in contact with the second thermal bonding layer and/or the beam emitter). The second sealing material may be disposed over substantially the entire external surface of the second electrode mount. The second sealing material may be disposed over at least a portion of the external surface of the beam emitter (i.e., the surface(s) of the beam emitter not facing and/or in contact with the second thermal bonding layer and/or the second electrode mount). The second sealing material may be disposed over substantially the entire external surface of the beam emitter. The second sealing material may not be disposed over the portion of the external surface of the beam emitter from which the beam(s) is/are emitted.

The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough.

In another aspect, embodiments of the invention feature a method of sealing a laser apparatus. A thermal bonding layer is disposed over a surface of an electrode mount (e.g., a heat sink). The thermal bonding layer includes, consists essentially of, or consists of a thermal bonding material A sealing material is deposited over at least a portion of the thermal bonding layer and at least a portion of an external surface of the electrode mount. A beam emitter is disposed in direct contact with the thermal bonding layer. At least a portion of the sealing material is positioned to prevent or retard movement of the thermal bonding material out of the thermal bonding layer (i.e., movement of the thermal bonding material from between the electrode mount and the beam emitter).

Embodiments of the invention may include one or more of the following in any of a variety of combinations. The beam emitter may be disposed in direct contact with the thermal bonding layer before the sealing material is deposited. The beam emitter may be disposed in direct contact with the thermal bonding layer after the sealing material is deposited. The sealing material may be disposed along at least a portion of the interface between the electrode mount and the beam emitter. The sealing material may be disposed around substantially the entire interface between the electrode mount and the beam emitter. The sealing material may be disposed over, or even in mechanical contact with, a lateral surface of the thermal bonding layer (e.g., the thermal bonding material). Portions of the sealing material may be in mechanical contact with the electrode mount and/or the beam emitter. The sealing material may include, consist essentially of, or consist of copper, aluminum, nickel, and/or chromium or an alloy or mixture of two or more of those metals or an alloy of mixture of one of those metals with one or more other metals. The sealing material may be disposed over at least a portion of the external surface of the electrode mount (i.e., the surface(s) of the electrode mount not facing and/or in contact with the thermal bonding layer and/or the beam emitter). The sealing material may be disposed over substantially the entire external surface of the electrode mount. The sealing material may be disposed over at least a portion of the external surface of the beam emitter (i.e., the surface(s) of the beam emitter not facing and/or in contact with the thermal bonding layer and/or the electrode mount). The sealing material may be disposed over substantially the entire external surface of the beam emitter. The sealing material may not be disposed over the portion of the external surface of the beam emitter from which the beam(s) is/are emitted. The beam emitter may include or consist essentially of one or more diode bars each emitting a plurality of discrete beams (e.g., laser beams). The thermal bonding material may include, consist essentially of, or consist of indium or an alloy or mixture of indium with one or more metals.

Before the beam emitter is disposed in direct contact with the thermal bonding layer, a portion of the sealing material may be removed to reveal an exposed portion of the thermal bonding layer. The beam emitter may be disposed in direct contact with the exposed portion of the thermal bonding layer (i.e., disposing the beam emitter in direct contact with the thermal bonding layer may include or consist essentially of disposing the beam emitter in direct contact with the exposed portion of the thermal bonding layer). A portion of the thermal bonding layer may be covered (e.g., coated) with a masking material before depositing the sealing material. After the sealing material is deposited, at least a portion of the masking material may be removed before disposing the beam emitter in direct contact with the thermal bonding layer. Depositing the sealing material may include, consist essentially of, or consist of electroplating and/or electroless deposition. The beam emitter may be disposed in contact with the thermal bonding layer before the thermal bonding layer is disposed on the electrode mount (e.g., the thermal bonding layer may be applied to the beam emitter before the coated beam emitter is disposed in contact with the electrode mount.

In yet another aspect, embodiments of the invention feature a method of sealing a laser apparatus. A thermal bonding layer is disposed over a surface of an electrode mount. The thermal bonding layer includes, consists essentially of, or consists of a thermal bonding material. A beam emitter is disposed in contact (e.g., direct mechanical contact) with the thermal bonding layer. Thereafter, a sealing material is deposited over at least a portion of the thermal bonding layer and at least a portion of an external surface of the electrode mount (i.e., the surface(s) of the electrode mount not facing and/or in contact with the thermal bonding layer and/or the beam emitter). The sealing material may be deposited over a portion of the beam emitter (e.g., a portion of the beam emitter proximate the thermal bonding layer). At least a portion of the sealing material is positioned to prevent or retard movement of the thermal bonding material out of the thermal bonding layer (i.e., movement of the thermal bonding material from between the electrode mount and the beam emitter).

Embodiments of the invention may include one or more of the following in any of a variety of combinations. The beam emitter may be disposed in contact with the thermal bonding layer before the thermal bonding layer is disposed on the electrode mount (e.g., the thermal bonding layer may be applied to the beam emitter before the coated beam emitter is disposed in contact with the electrode mount. The sealing material may be disposed along at least a portion of the interface between the electrode mount and the beam emitter. The sealing material may be disposed around substantially the entire interface between the electrode mount and the beam emitter. The sealing material may be disposed over, or even in mechanical contact with, a lateral surface of the thermal bonding layer (e.g., the thermal bonding material). Portions of the sealing material may be in mechanical contact with the beam emitter. The sealing material may include, consist essentially of, or consist of copper, aluminum, nickel, and/or chromium or an alloy or mixture of two or more of those metals or an alloy of mixture of one of those metals with one or more other metals. The sealing material may be disposed over substantially the entire external surface of the electrode mount. The sealing material may be disposed over at least a portion of the external surface of the beam emitter (i.e., the surface(s) of the beam emitter not facing and/or in contact with the thermal bonding layer and/or the electrode mount). The sealing material may be disposed over substantially the entire external surface of the beam emitter. The sealing material may not be disposed over the portion of the external surface of the beam emitter from which the beam(s) is/are emitted. The beam emitter may include or consist essentially of one or more diode bars each emitting a plurality of discrete beams (e.g., laser beams). The thermal bonding material may include, consist essentially of, or consist of indium or an alloy or mixture of indium with one or more metals.

The sealing material may be deposited over at least a portion of the beam emitter. At least a portion of the sealing material may be removed to reveal a portion of the beam emitter (e.g., the portion of the beam emitter from which the beam(s) is/are emitted). One or more portions of the beam emitter and/or the electrode mount may be covered with a masking material before the sealing material is deposited. At least some of the masking material may be removed after depositing the sealing material. Depositing the sealing material may include, consist essentially of, or consist of electroplating and/or electroless deposition.

In another aspect, embodiments of the invention feature a wavelength beam combining laser system that includes or consists essentially of a beam emitter, focusing optics, a dispersive element, a partially reflective output coupler, a first electrode mount disposed proximate (e.g., beneath) the first surface of the beam emitter, a thermal bonding layer disposed at an interface between the first electrode mount and the first surface of the beam emitter, and a sealing material disposed along at least a portion of the interface between the first electrode mount and the first surface of the beam emitter. The beam emitter emits a plurality of discrete beams (e.g., laser beams) and has first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The thermal bonding layer improves thermal conduction between the first electrode mount and the beam emitter. The thermal bonding layer includes, consists essentially of, or consists of a thermal bonding material. The sealing material may prevent or retard movement of the thermal bonding material out of the thermal bonding layer (i.e., movement of the thermal bonding material from between the first electrode mount and the housing body) The sealing material may prevent or retard the formation of voids within the thermal bonding material and/or the thermal bonding layer.

Embodiments of the invention may include one or more of the following in any of a variety of combinations. The dispersive element may include or consist essentially of a diffraction grating (e.g., a reflective grating or a transmissive grating). The thermal bonding material may include, consist essentially of, or consist of indium or an alloy or mixture of indium with one or more metals. The sealing material may include, consist essentially of, or consist of copper, aluminum, nickel, and/or chromium or an alloy or mixture of two or more of those metals or an alloy of mixture of one of those metals with one or more other metals. A second electrode mount may be disposed proximate (e.g., over) the second surface of the beam emitter. The second electrode mount may be electrically insulated from the first electrode mount. The second electrode mount may be in electrical contact with the second surface of the beam emitter. A second thermal bonding layer may be disposed at an interface between the second electrode mount and the second surface of the beam emitter. The second thermal bonding layer may include, consist essentially of, or consist of a second thermal bonding material. A second sealing material may be disposed along at least a portion of the interface between the second electrode mount and the second surface of the beam emitter. The second sealing material may be disposed around substantially the entire interface between the second electrode mount and the second surface of the beam emitter. The second sealing material may be disposed over, or even in mechanical contact with, a lateral surface of the second thermal bonding layer (e.g., the second thermal bonding material). Portions of the second sealing material may be in mechanical contact with the second electrode mount and/or the beam emitter. The second sealing material may prevent or retard movement of the second thermal bonding material out of the second thermal bonding layer (i.e., movement of the second thermal bonding material from between the second electrode mount and the beam emitter). The second sealing material may prevent or retard the formation of voids within the second thermal bonding material and/or the second thermal bonding layer. The thermal bonding material and the second thermal bonding material may include, consist essentially of, or consist of the same material. The thermal bonding material and the second thermal bonding material may include, consist essentially of, or consist of different materials. The second sealing material may include, consist essentially of, or consist of copper, aluminum, nickel, and/or chromium or an alloy or mixture of two or more of those metals or an alloy of mixture of one of those metals with one or more other metals. The second sealing material may be disposed over at least a portion of the external surface of the second electrode mount (i.e., the surface(s) of the second electrode mount not facing and/or in contact with the second thermal bonding layer and/or the beam emitter). The second sealing material may be disposed over substantially the entire external surface of the second electrode mount. The second sealing material may be disposed over at least a portion of the external surface of the beam emitter (i.e., the surface(s) of the beam emitter not facing and/or in contact with the second thermal bonding layer and/or the second electrode mount). The second sealing material may be disposed over substantially the entire external surface of the beam emitter. The second sealing material may not be disposed over the portion of the external surface of the beam emitter from which the beam(s) is/are emitted.

The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
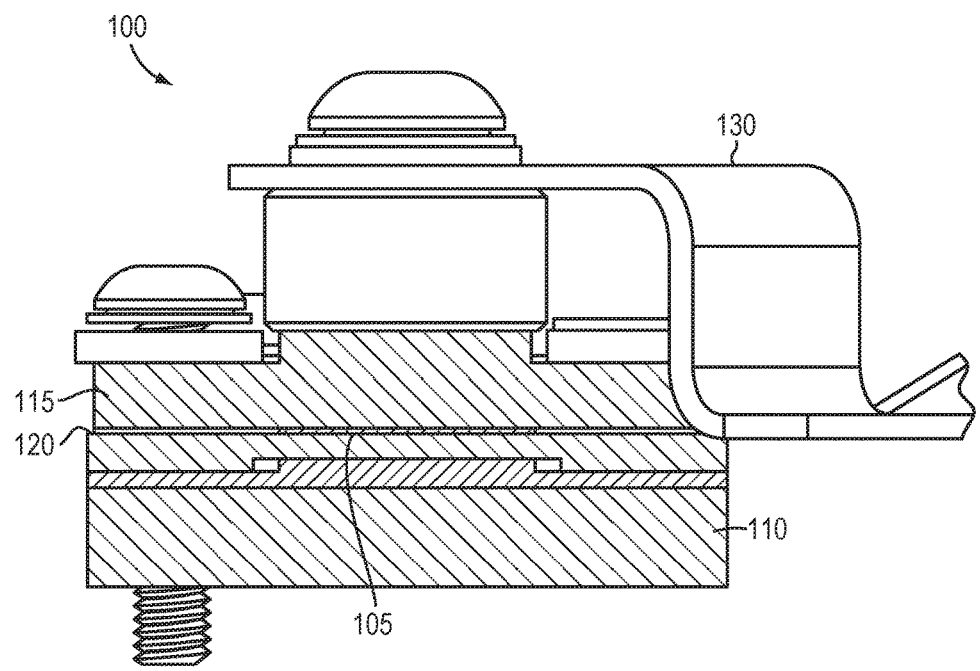
FIGS. 1 and 2 are, respectively, a side view and a perspective view of a packaged laser in accordance with embodiments of the invention.
Figure 2:
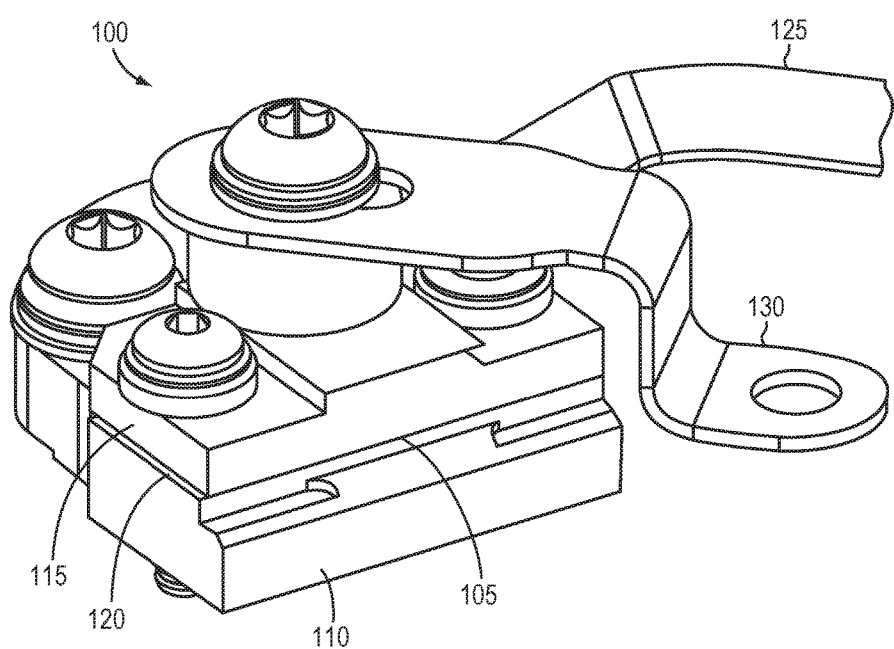

FIGS. 1 and 2 depict portions of an exemplary packaged laser 100 in accordance with embodiments of the present invention. As shown, the laser 100 includes a beam emitter 105 sandwiched between two electrode mounts 110, 115. The beam emitter 105 may include or consist essentially of, e.g., a laser diode, a diode bar, an array of laser diodes, an array of diode bars, or one or more vertical cavity surface-emitting lasers (VCSELs). The electrode mounts 110, 115 are thermally connected to the beam emitter 105 and each electrically connected to one of the electrodes (i.e., the anode and the cathode) of the beam emitter 105. For example, the electrode mount 110 may be electrically connected to the anode of beam emitter 105 and the electrode mount 115 may be electrically connected to the cathode of beam emitter 105, or vice versa. The electrode mounts 110, 115 are typically highly thermally and electrically conductive; thus, in various embodiments, the electrode mounts 110, 115 include, consist essentially of, or consist of one or more metals such as copper, silver, or gold. An insulating layer 120 is disposed around the beam emitter 105 and between the electrode mounts 110, 115, thereby electrically isolating the electrode mounts 110, 115 from each other. As shown, the electrode mounts 110, 115 may be fastened together and to the beam emitter 105 via, e.g., one or more fasteners such as screws, which may also attach the electrode mounts to a housing (as detailed below). Conductive contacts 125, 130 are connected to and extend from the electrode mounts 110, 115 in order to facilitate interconnection of the laser 100 to, for example, other laser devices (in series or in parallel) or to a source of electrical power (e.g., a current source). Laser 100 may also incorporate one or more features described in, and/or be fabricated in accordance with, U.S. Pat. No. 9,178,333, filed on Mar. 24, 2015, the entire disclosure of which is incorporated herein by reference.

Figure 3:
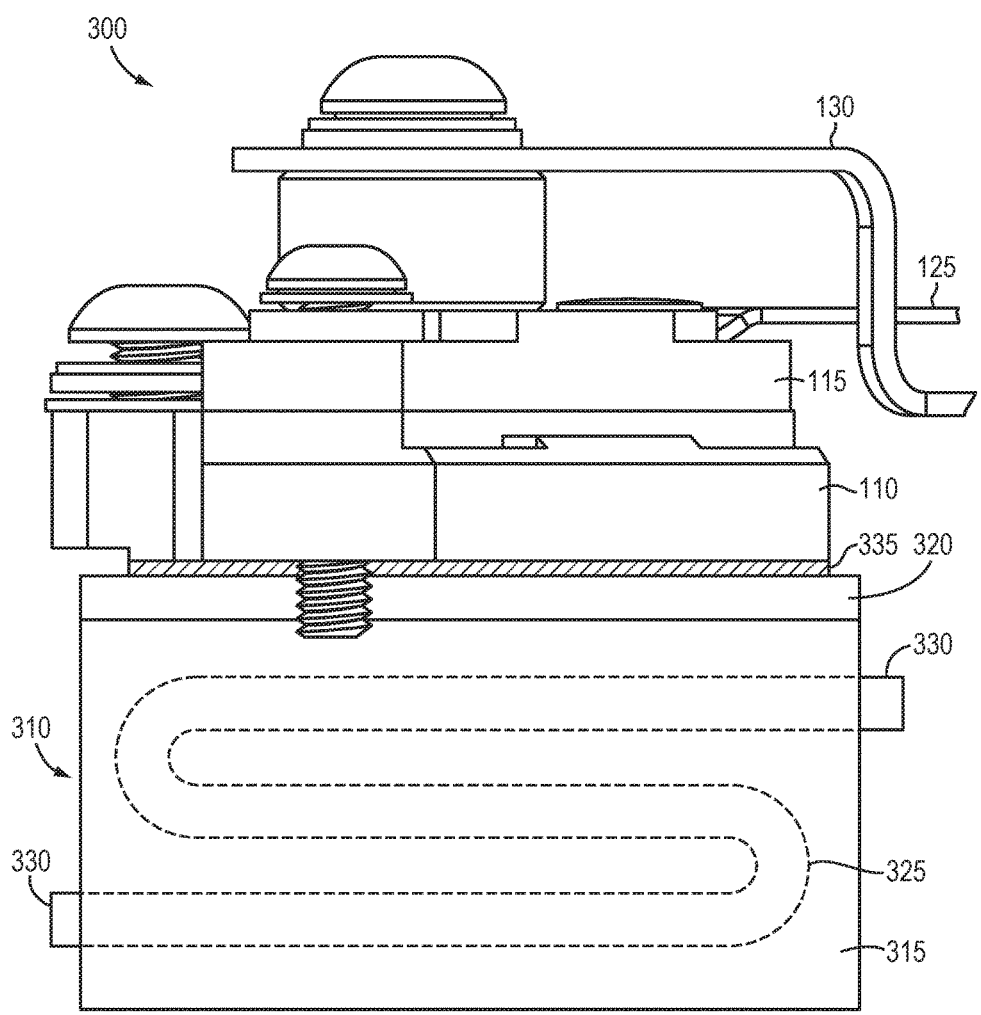
FIGS. 3 and 4 are side views of packaged lasers in accordance with embodiments of the invention.

FIG. 3 depicts a laser device 300 in which one or both electrode mounts 110, 115 are fastened or affixed to a thermally conductive housing 310. The housing 310 may include or consist essentially of a housing body 315 capped with an insulating layer 320 that retards or substantially prevents electrical conduction between the electrode mount 110 and the housing body 315 while maintaining thermal conductivity therebetween. For example, the insulating layer 320 may include, consist essentially of, or consist of aluminum nitride, boron arsenide, diamond, and/or beryllium oxide. In some embodiments, the insulating layer 320 may not be present. The housing body 315 may include, consist essentially of, or consist of one or more thermally conductive metals or ceramic materials. In an embodiment, the housing body 315 includes, consists essentially, or consists of a thermally conductive metal such as aluminum or copper. As shown in FIG. 3, the housing body 315 may also incorporate therewithin one or more cooling channels 325 through which a coolant (e.g., a liquid such as water) may flow to remove heat from the housing body. A coolant source and coolant sink may be connected to the cooling channel 325 via coolant interconnections 330. A coolant reservoir and, e.g., a heat exchanger, may be fluidly connected to the cooling channel 325 and provide coolant thereto. Such cooling systems are conventional and may be utilized with embodiments of the present invention without undue experimentation.

The insulating layer 320 may include, consist essentially of, or consist of, e.g., an oxide or a nitride of the metal of which the housing body 315 is composed. For example, for a housing body 315 that includes, consists essentially of, or consists of aluminum, the insulating layer 320 may include, consist essentially of, or consist of one or more layers of aluminum oxide and/or aluminum nitride. In some embodiments, a thermal bonding layer 335 is utilized to enhance contact (and thus thermal conduction) between the electrode mount 110 and the housing 310, even if the insulating layer 320 has a rough surface. The thermal bonding layer 335 may include, consist essentially of, or consist of, for example, a thermal bonding material such as a thermally conductive solder, foil, liquid, paste, or gel material such as indium (e.g., indium paste or solder) or silver paste. The thickness of the thermal bonding layer 335 may be, for example, between approximately 0.5 µm and approximately 150 µm. The thickness of the insulating layer 320 may be, for example, between approximately 5 µm and approximately 150 µm. In various embodiments, a thermal bonding layer 335 may also be present between the beam emitter 105 and one or both of the electrode mounts 110, 115. As described in more detail below, thermal bonding layers 335 and/or portions of components in contact therewith may be sealed with a sealing material in accordance with embodiments of the present invention to minimize or prevent creep of the thermal bonding layer 335. Thermal bonding layers and laser devices in accordance with embodiments of the invention may also incorporate one or more structures or systems for inhibiting movement of thermal bonding material as described in U.S. Provisional Patent Application No. 62/108,250, filed Jan. 27, 2015, the entire disclosure of which is incorporated by reference herein.

All or a portion of the insulating layer 320 may be a nitride layer formed via, e.g., direct nitridation of the housing body 315 and/or carbothermic reduction of an oxide layer on housing body 315. For example, an insulating layer 320 (or a topmost insulating layer 320) that includes, consists essentially of, or consists of aluminum nitride may be formed via exposure of an aluminum housing body 315 (or an aluminum oxide layer thereon) to a nitrogen ambient (i.e., a surrounding environment including nitrogen or a nitrogen-containing species) at elevated temperature (e.g., greater than 1200° C.). An aluminum oxide insulating layer 320 may be formed on an aluminum housing body 315 via, e.g., anodization. In an exemplary anodization process, the housing body 315 is first cleaned in either a hot soak cleaner or in a solvent bath and may be etched in sodium hydroxide (normally with added sodium gluconate), ammonium bifluoride, or brightened in a mix of acids. The anodized layer may be produced by passing a direct current through an electrolytic solution, with the housing body 315 serving as the anode (the positive electrode). The current releases hydrogen at the cathode (the negative electrode) and oxygen at the surface of the housing body 315 anode, creating a build-up of aluminum oxide. The voltage utilized for various solutions may range from 1 to 300 V DC, although most fall in the range of 15 to 21 V. Higher voltages are typically required for thicker coatings formed in sulfuric and organic acid. The anodizing current varies with the area of housing body 315 being anodized, and typically ranges from 30 to 300 amperes/meter$^2$ (2.8 to 28 ampere/ft$^2$).

In some embodiments, anodizing of aluminum housing bodies 315 is performed in an acid solution which slowly dissolves the aluminum oxide. The acid action is balanced with the oxidation rate to form a coating with nanopores 10-150 nm in diameter. These pores allow the electrolyte solution and current to reach the aluminum surface and continue producing the coating to greater thickness beyond what is produced by autopassivation. In some embodiments, these pores are sealed in order to prevent air or water from reaching the housing body 315 and initiating corrosion. In one implementation, a crystallized, partially crystallized, or micro-crystalline filler is placed into the pores, as disclosed in U.S. Pat. Nos. 8,512,872 and 8,609,254, the entire disclosure of each of which is incorporated by reference herein.

Pores in an insulating layer 320 may be at least partially impregnated or filled by introducing one or more compounds that are at least partially resistant to acidic attack or alkaline attack under various conditions. For example, the one or more compounds (e.g., metal cationic species) may be introduced into the pores by immersion of the housing body 315 in a bath containing one or more precursor compounds under conditions that are non-reactive to the housing body 315 or an oxide thereof. In accordance with various embodiments of the invention, the housing body 315, which may include, consist essentially of, or consist of anodized aluminum or an anodized aluminum alloy, is immersed in a first aqueous metal salt solution, preferably at ambient conditions. In addition or instead, one or more metal cationic species may be introduced into at least some of the pores by, for example, immersing the housing body 315 in an aqueous metal solution. The metal species or base metal salt in solution may at least partially impregnate at least a portion of the anodic oxide pores by diffusion phenomena. Non-limiting examples of the metal that may be utilized as a precursor compound include nickel, iron, zinc, copper, magnesium, titanium, zirconium, aluminum, and silver. The bath or aqueous metal solution may have a pH of less than about 7 and a temperature in a range of from about 15' C. to about 35' C.

Figure 4:
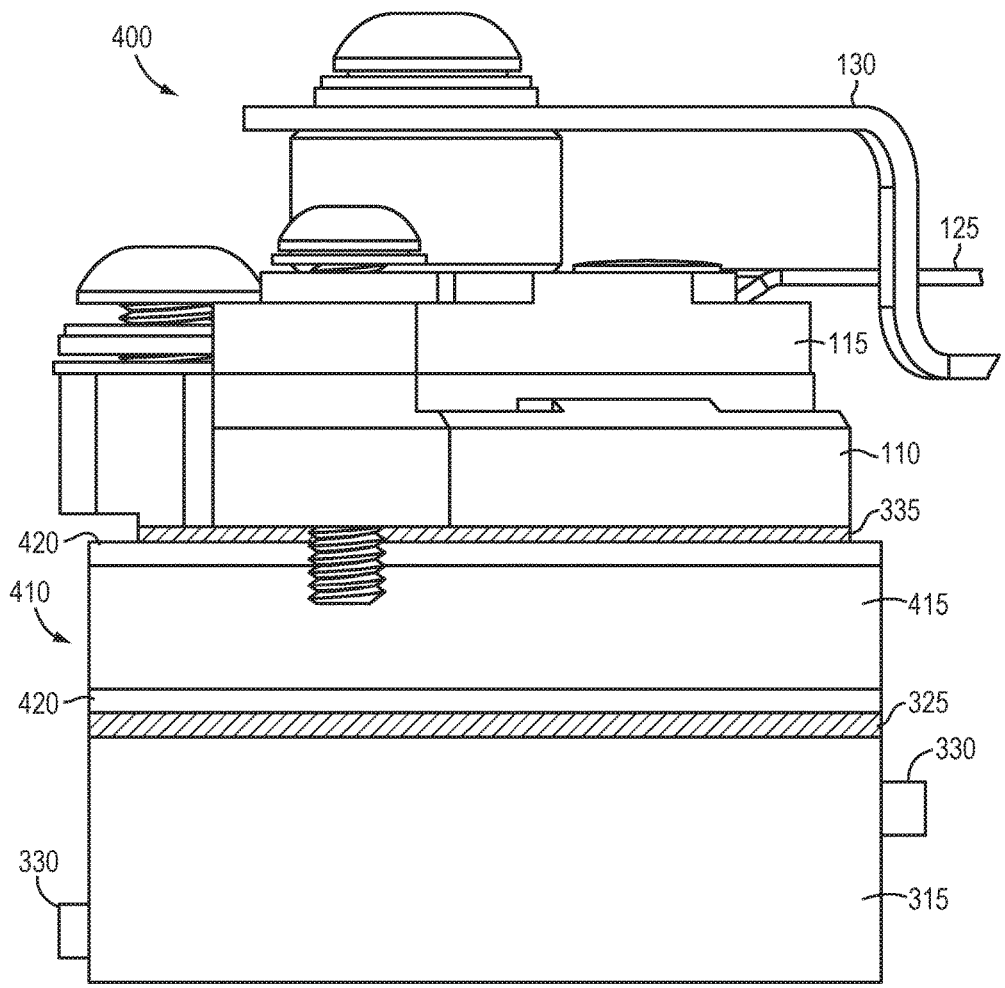

FIG. 4 depicts a packaged laser 400 featuring a composite housing 410 electrically insulated from but thermally connected to the electrode mount 110 of laser 100. As shown, the composite housing 410 may feature a ceramic body 415 mounted on and/or affixed to housing body 315. The ceramic body 415 may be thermally connected to electrode mount 110 and/or to housing body 315 via one or more thermal bonding layers 335 therebetween. The ceramic body 415 may include, consist essentially of, or consist of, for example, aluminum nitride. As shown in FIG. 4, the ceramic body 415 may also have interfacial layers 420 on one or more surfaces thereof. For example, the interfacial layers 420 may improve thermal conductivity to the bulk of the ceramic body 415 via increased interfacial contact (due to, e.g., reduced surface roughness) to the thermal bonding layers 335. The interfacial layers 420 may include, consist essentially of, or consist of one or more thermally conductive metals such as copper, silver, or gold. For example, the interfacial layers 420 may include, consist essentially of, or consist of direct-bond copper or copper flashing disposed on the ceramic body 415.

Figure 5A:
FIGS. 5A-5D are cross-sectional views of components of laser devices undergoing various steps of a sealing process in accordance with embodiments of the invention.
Figure 5A:
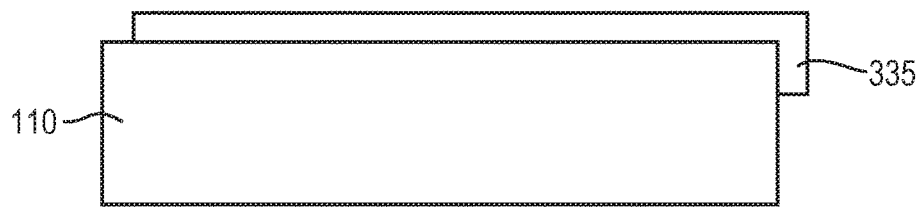

As mentioned above, various embodiments of the present invention feature sealing materials to minimize or reduce creep of one or more thermal bonding layers. FIG. 5A depicts electrode mounts 110, 115 each with a thermal bonding layer 335 disposed thereon. As mentioned above, a thermal bonding layer 335 may include, consist essentially of, or consist of a thermal bonding material. The thermal bonding material may include, consist essentially of, or consist of, for example, a thermally conductive solder, foil, liquid, paste, or gel material that includes, consists essentially of, or consists of one or more materials such as indium, lead, tin, silver, and/or an alloy thereof. The thermal bonding material may have a melting point between, e.g., approximately 90° C. and approximately 450° C., between approximately 100° C. and approximately 250° C., or between approximately 140° C. and approximately 200° C. As shown in FIG. 5D, the thermal bonding layers 335 provide a thermal connection between the electrode mounts 110, 115 and the beam emitter 105. (Although FIGS. 5A-5D depict both electrode mounts 110, 115 being at least partially sealed and subsequently thermally connected to beam emitter 105, embodiments of the invention include laser devices in which only one of electrode mounts 110, 115 is utilized.)

Figure 5B:
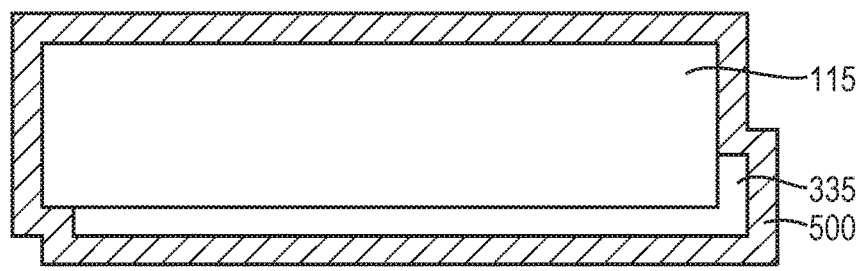
Figure 5B:
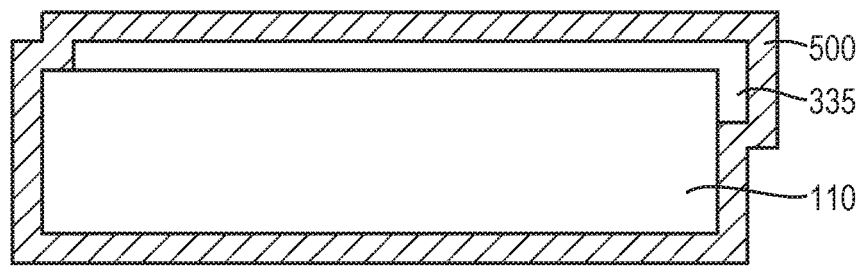

As shown in FIG. 5B, each of the electrode mounts 110, 115 with the thermal bonding layer 335 applied thereto may be at least partially sealed with a sealing material 500 to prevent creep of the thermal bonding material from areas between the beam emitter 105 and the electrode mounts. The sealing material 500 may extend around substantially the entire surface area of the electrode mount and associated thermal bonding layer 335. The sealing material 500 is generally substantially impervious to transport of the thermal bonding material therethrough, and therefore substantially prevents egress of the thermal bonding material in the assembled laser device. The sealing material 500 may include, consist essentially of, or consist of one or more metals, e.g., thermally conductive metals, and it may have a melting point higher than that of the thermal bonding layer 335 (e.g., of the thermal bonding material). For example, the sealing material 500 may include, consist essentially of, or consist of copper, aluminum, nickel, chromium, or an alloy of two or more of those metals or one or more of those metals with one or more other metals. The sealing material 500 may have a hardness higher than that of the thermal bonding material. In various embodiments, the sealing material 500 and the thermal bonding material are substantially mutually insoluble (i.e., no more than approximately 10%, or even no more than approximately 5%, of the sealing material 500 or the thermal bonding material may dissolve into the other to form a solid solution), at least at temperatures of typical operation of the assembled laser device (e.g., temperatures reached by components in contact with the thermal bonding material) or lower.

The sealing material 500 may be applied to the electrode mounts and thermal bonding layers via any of a variety of different techniques. For example, the sealing material 500 may be deposited by a technique such as electroplating, electroless deposition, chemical vapor deposition, or sputtering. In an electroplating process in accordance with embodiments of the invention, as known in the art, the component to be sealed is immersed in a bath containing ions of the sealing material 500 and/or an anode including, consisting essentially of, or consisting of the sealing material 500, and an applied current results in the deposition of the ions onto the component, which acts as the cathode. In an electroless deposition process in accordance with embodiments of the invention, as known in the art, the electroplating current source is absent, and the bath contains a reducing agent (e.g., a hydrogen-based reducer such as hypophosphite or a low molecular weight aldehyde) that drives the plating reaction.

Figure 5C:
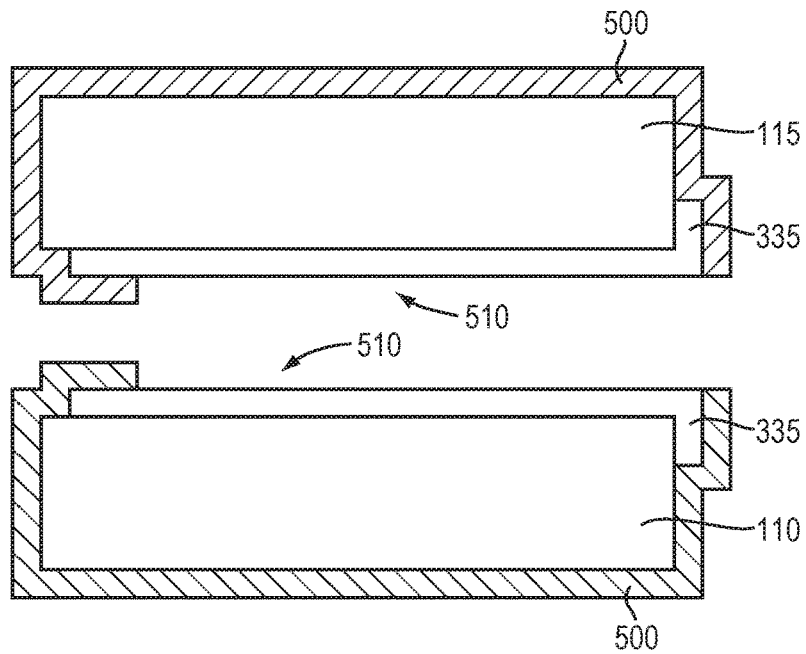
Figure 5D:
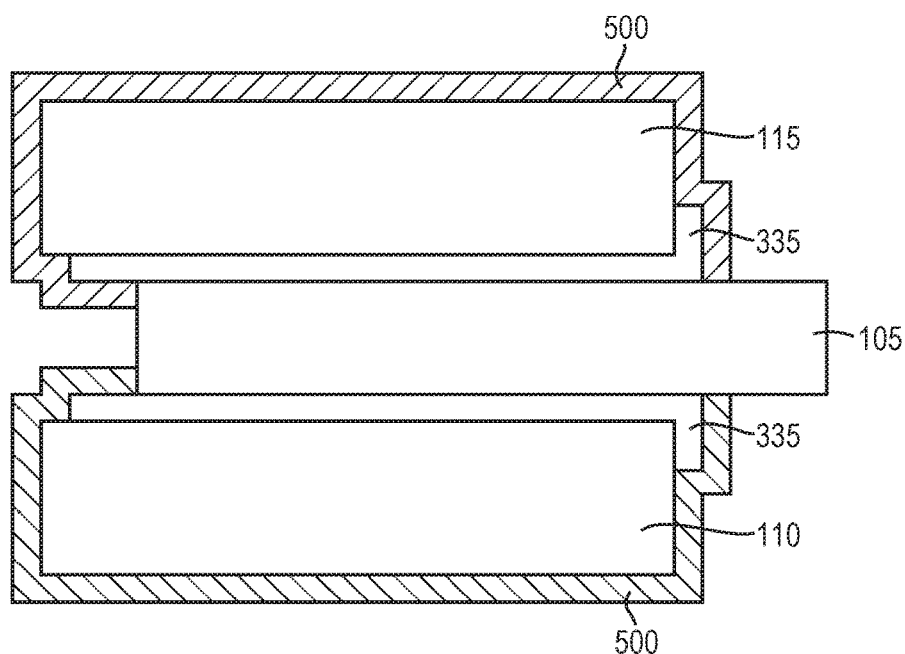

In various embodiments of the invention one or more portions of the sealing material 500 may be removed from the electrode mount and/or the thermal bonding layer 335. As shown in FIG. 5C, portions of the sealing material 500 may be removed from the thermal bonding layers 335 which are intended to directly contact the beam emitter in the assembled laser device, thereby forming exposed regions 510. As shown in FIG. 5D, the beam emitter 105 may be disposed between sealed electrode mounts 110, 115 such that it directly contacts the thermal bonding layers 335 (thereby ensuring good thermal contact) while the remaining portions of the sealing material 500 prevent egress of the thermal bonding material from the interfaces between the beam emitter 105 and the electrode mounts 110, 115. The portions of the sealing material 500 on regions 510 may be removed by, e.g., etching (for example, where other regions of the sealing material 500 are masked by a protective layer inert to the etchant) or mechanical removal methods such as machining or grinding.

In other embodiments of the invention, the sealing material 500 is not formed on the regions 510 during the initial sealing process. In such embodiments, regions 510 may be initially covered or coated with a masking material such as wax, tape, etc. The sealing material 500 is not deposited on the masked-off regions 510, and after the depositing process (e.g., electroplating or electroless deposition), the masking material is simply removed to reveal regions 510 as shown in FIG. 5C.

Figure 6A:
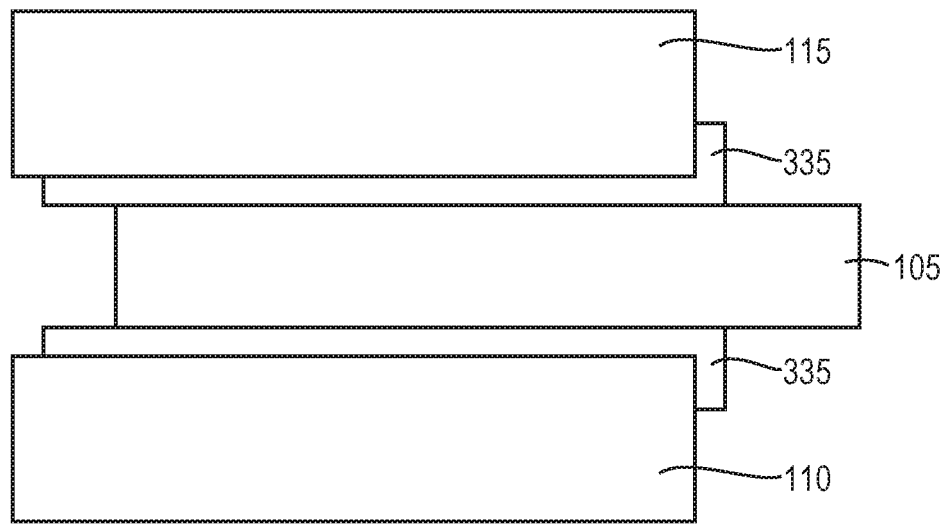
FIGS. 6A and 6B are cross-sectional views of components of laser devices undergoing various steps of a sealing process in accordance with embodiments of the invention.
Figure 6B:
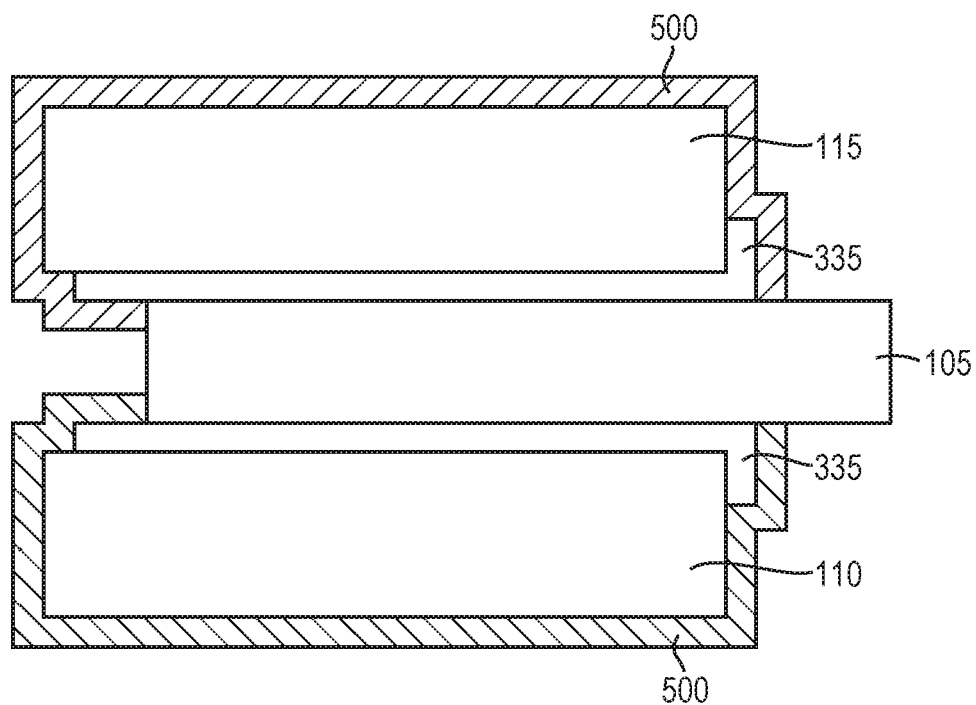

As shown in FIG. 6A, in accordance with embodiments of the present invention, various components of the laser device may be assembled together before application of the sealing material. As shown, the electrode mounts 110, 115 may be affixed to the beam emitter 105 with thermal bonding layers 335 therebetween prior to the application of the sealing material. As shown in FIG. 6B, the sealing material 500 may be applied to the entire assembly shown in FIG. 6A, thereby sealing the thermal bonding layers 335 and preventing egress of the thermal bonding material during operation of the laser device. As detailed above, exposed portions of the beam emitter 105 may either be masked off, thereby preventing any deposition of the sealing material 500, or the sealing material 500 may be deposited on such areas and subsequently removed by, e.g., etching or mechanical removal techniques.

Figure 7:
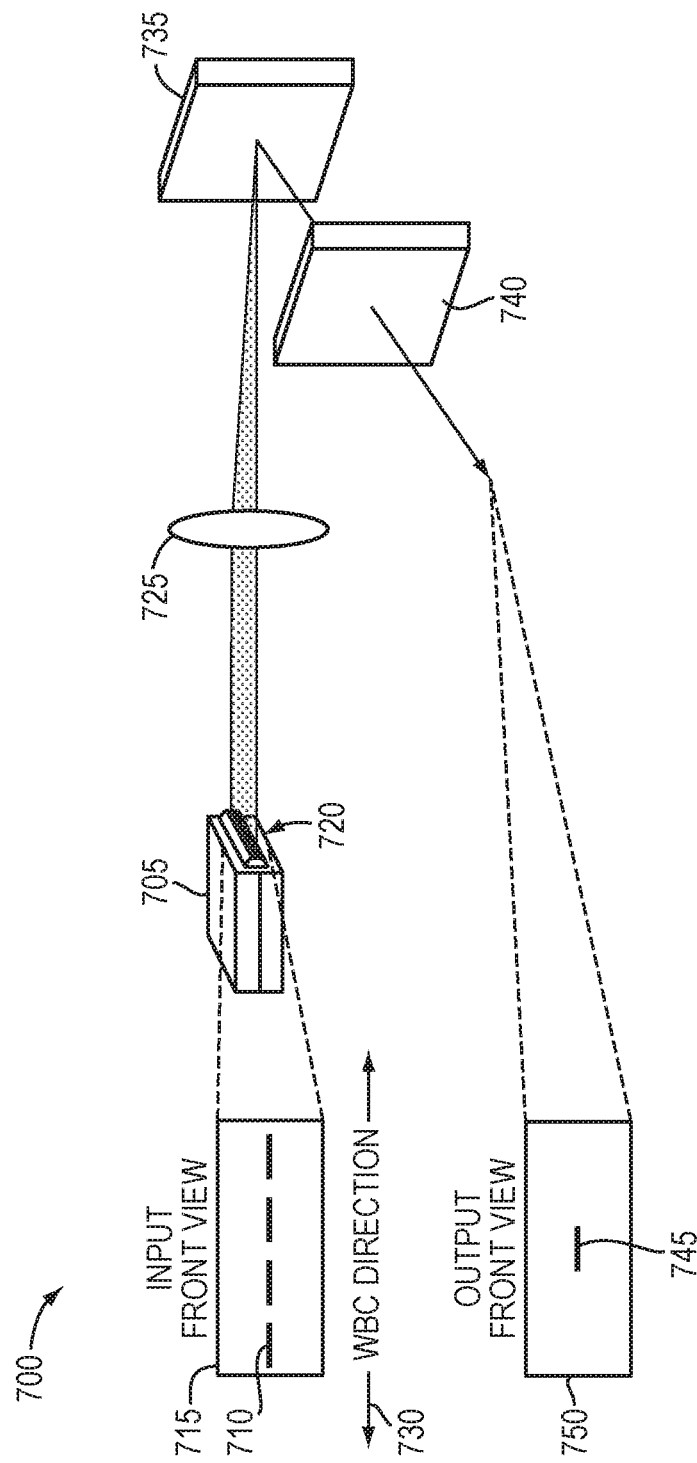
FIG. 7 is a schematic view of a wavelength beam combining laser system incorporating a packaged laser in accordance with embodiments of the invention.

Packaged lasers in accordance with embodiments of the present invention may be utilized in WBC laser systems. FIG. 7 depicts an exemplary WBC laser system 700 that utilizes a packaged laser 705. The packaged laser 705 may correspond to, for example, lasers 100, 300, or 400 as detailed herein, and may incorporate, for example, one or more thermal bonding layers 335 and a sealing material 500 as detailed herein. In the example of FIG. 7, laser 705 features a diode bar having four beam emitters emitting beams 710 (see magnified input view 715), but embodiments of the invention may utilize diode bars emitting any number of individual beams or two-dimensional arrays or stacks of diodes or diode bars. In view 715, each beam 710 is indicated by a line, where the length or longer dimension of the line represents the slow diverging dimension of the beam, and the height or shorter dimension represents the fast diverging dimension. A collimation optic 720 may be used to collimate each beam 710 along the fast dimension. Transform optic(s) 725, which may include or consist essentially of one or more cylindrical or spherical lenses and/or mirrors, are used to combine each beam 710 along a WBC direction 730. The transform optics 725 then overlap the combined beam onto a dispersive element 735 (which may include or consist essentially of, e.g., a diffraction grating such as a reflective or transmissive diffraction grating), and the combined beam is then transmitted as single output profile onto an output coupler 740. The output coupler 740 then transmits the combined beams 745 as shown on the output front view 750. The output coupler 740 is typically partially reflective and acts as a common front facet for all the laser elements in this external cavity system 700. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of sealing a laser apparatus, the method comprising:
    disposing a thermal bonding layer over a surface of an electrode mount, the thermal bonding layer comprising a thermal bonding material;
    thereafter, depositing an electrically conductive sealing material over at least a portion of the thermal bonding layer and at least a portion of an external surface of the electrode mount, wherein the thermal bonding material and the sealing material comprise different materials; and
    disposing a beam emitter in direct mechanical contact with the thermal bonding layer,
    wherein at least a portion of the sealing material is positioned to prevent or retard movement of the thermal bonding material out of the thermal bonding layer.

2. The method of claim 1, further comprising:
    covering a portion of the thermal bonding layer with a masking material before depositing the sealing material; and
    after depositing the sealing material, removing the masking material before disposing the beam emitter in direct contact with the thermal bonding layer.

3. The method of claim 1, wherein depositing the sealing material comprises at least one of electroplating or electroless deposition.

4. The method of claim 1, wherein the thermal bonding material comprises indium.

5. The method of claim 1, wherein the sealing material comprises at least one of copper, aluminum, nickel, or chromium.

6. The method of claim 1, further comprising disposing a second electrode mount over the beam emitter opposite the electrode mount.

7. The method of claim 6, further comprising:
    disposing a second thermal bonding layer between the second electrode mount and the beam emitter, the second thermal bonding layer comprising a second thermal bonding material; and
    positioning a second sealing material to prevent or retard movement of the second thermal bonding material out of the second thermal bonding layer.

8. The method of claim 1, wherein the beam emitter comprises a diode bar configured to emit a plurality of discrete beams.

9. The method of claim 1, wherein a melting point of the sealing material is higher than a melting point of the thermal bonding material.

10. The method of claim 1, wherein no portion of the sealing material is disposed between the thermal bonding layer and the electrode mount.

11. The method of claim 1, wherein a portion of the sealing material is in direct contact with an external surface of the beam emitter.

12. The method of claim 1, wherein a portion of the sealing material is disposed on a portion of the external surface of the electrode mount that does not face toward the beam emitter.

13. The method of claim 1, wherein, after the beam emitter is disposed in direct contact with the thermal bonding layer, the thermal bonding layer is surrounded on all sides by the sealing material, the electrode mount, and the beam emitter.

14. A method of sealing a laser apparatus, the method comprising:
 disposing a thermal bonding layer over a surface of an electrode mount, the thermal bonding layer comprising a thermal bonding material;
 disposing a beam emitter in direct mechanical contact with the thermal bonding layer; and
 after the thermal bonding layer is disposed over the surface of the electrode mount, and after the beam emitter is disposed in direct contact with the thermal bonding layer, depositing an electrically conductive sealing material over at least a portion of the thermal bonding layer and at least a portion of an external surface of the electrode mount,
 wherein (i) the thermal bonding material and the sealing material comprise different materials, and (ii) at least a portion of the sealing material is positioned to prevent or retard movement of the thermal bonding material out of the thermal bonding layer.

15. The method of claim 14, further comprising:
 covering a portion of the beam emitter with a masking material before depositing the sealing material; and
 removing the masking material after depositing the sealing material.

16. The method of claim 14, wherein depositing the sealing material comprises at least one of electroplating or electroless deposition.

17. The method of claim 14, wherein the thermal bonding material comprises indium.

18. The method of claim 14, wherein the sealing material comprises at least one of copper, aluminum, nickel, or chromium.

19. The method of claim 14, further comprising disposing a second electrode mount over the beam emitter opposite the electrode mount.

20. The method of claim 19, further comprising:
 disposing a second thermal bonding layer between the second electrode mount and the beam emitter, the second thermal bonding layer comprising a second thermal bonding material; and
 positioning a second sealing material to prevent or retard movement of the second thermal bonding material out of the second thermal bonding layer.

21. The method of claim 14, wherein the beam emitter comprises a diode bar configured to emit a plurality of discrete beams.

22. The method of claim 14, wherein a melting point of the sealing material is higher than a melting point of the thermal bonding material.

23. The method of claim 14, wherein no portion of the sealing material is disposed between the thermal bonding layer and the electrode mount.

24. The method of claim 14, wherein a portion of the sealing material is in direct contact with an external surface of the beam emitter.

25. The method of claim 14, wherein a portion of the sealing material is disposed on a portion of the external surface of the electrode mount that does not face toward the beam emitter.

26. The method of claim 14, wherein, after the sealing material is deposited over the at least a portion of the thermal bonding layer and the at least a portion of the external surface of the electrode mount, the thermal bonding layer is surrounded on all sides by the sealing material, the electrode mount, and the beam emitter.

27. A method of sealing a laser apparatus, the method comprising:
 disposing a thermal bonding layer over a surface of an electrode mount, the thermal bonding layer comprising a thermal bonding material;
 thereafter, depositing an electrically conductive sealing material over an entirety of the thermal bonding layer and at least a portion of an external surface of the electrode mount;
 removing a portion of the sealing material to reveal an exposed portion of the thermal bonding layer; and
 disposing a beam emitter in direct contact with the exposed portion of the thermal bonding layer,
 wherein at least a portion of the sealing material is positioned to prevent or retard movement of the thermal bonding material out of the thermal bonding layer.

28. A method of sealing a laser apparatus, the method comprising:
 disposing a thermal bonding layer over a surface of an electrode mount, the thermal bonding layer comprising a thermal bonding material;
 disposing a beam emitter in direct contact with the thermal bonding layer;
 after the thermal bonding layer is disposed over the surface of the electrode mount, and after the beam emitter is disposed in direct contact with the thermal bonding layer, depositing an electrically conductive sealing material over at least a portion of the thermal bonding layer and at least a portion of an external surface of the electrode mount;
 depositing the sealing material over at least a portion of the beam emitter; and
 removing at least a portion of the sealing material to reveal a portion of the beam emitter,
 wherein at least a portion of the sealing material is positioned to prevent or retard movement of the thermal bonding material out of the thermal bonding layer.

* * * * *